United States Patent [19]

Rutledge

[11] Patent Number: 4,878,847

[45] Date of Patent: Nov. 7, 1989

[54] PATCHFIELD SYSTEM

[75] Inventor: Michael J. W. Rutledge, Collingwood, Australia

[73] Assignee: Rutledge Engineering (Aust.) Pty. Ltd., Australia

[21] Appl. No.: 225,387

[22] Filed: Jul. 28, 1988

[30] Foreign Application Priority Data

Jul. 29, 1987 [AU] Australia .................. PI3416

[51] Int. Cl.$^4$ .............................. H01R 9/09
[52] U.S. Cl. ......................... 439/74; 439/76
[58] Field of Search ............. 439/76, 55, 65, 67, 439/74, 77, 493, 497, 43, 49

[56] References Cited

U.S. PATENT DOCUMENTS

| | | | |
|---|---|---|---|
| 3,399,372 | 8/1968 | Uberbacher | 439/60 |
| 3,660,728 | 5/1972 | Carter | 439/76 |
| 4,157,612 | 6/1979 | Rainal | 439/493 |
| 4,655,535 | 4/1987 | Kysiak | 439/669 |

Primary Examiner—Neil Abrams
Assistant Examiner—Khiem Nguyen
Attorney, Agent, or Firm—Stevens, Davis, Miller & Mosher

[57] ABSTRACT

A printed circuit patchfield assembly comprising a plurality of electrical jack means arranged into a first and a second group are mounted in a front panel of the assembly. First and second double-sided printed circuit boards are provided in the assembly, the boards each having a first plurality of electrically conducting tracks on one side thereof and a second plurality of electrically conducting tracks on the other side thereof. A plurality of multi-contact electrical connectors are provided in a rear panel of the assembly and these are connected to the main springs of each of the jack means by the first plurality of conducting tracks. The first group of electrical jack means can be electrically connected to the second group by means of an internal connecting ribbon cable which connects the second plurality of conducting tracks on the first board with the second plurality of conducting tracks on the second board. The first and second plurality of conducting tracks on both boards are electrically connected by means of plated through-holes extending through the respective boards. Various normalling options between the first and second group of jack means can be selected by dimpling appropriate ones of conducting pads arranged on the printed circuit boards at the locations of the through-holes.

11 Claims, 4 Drawing Sheets

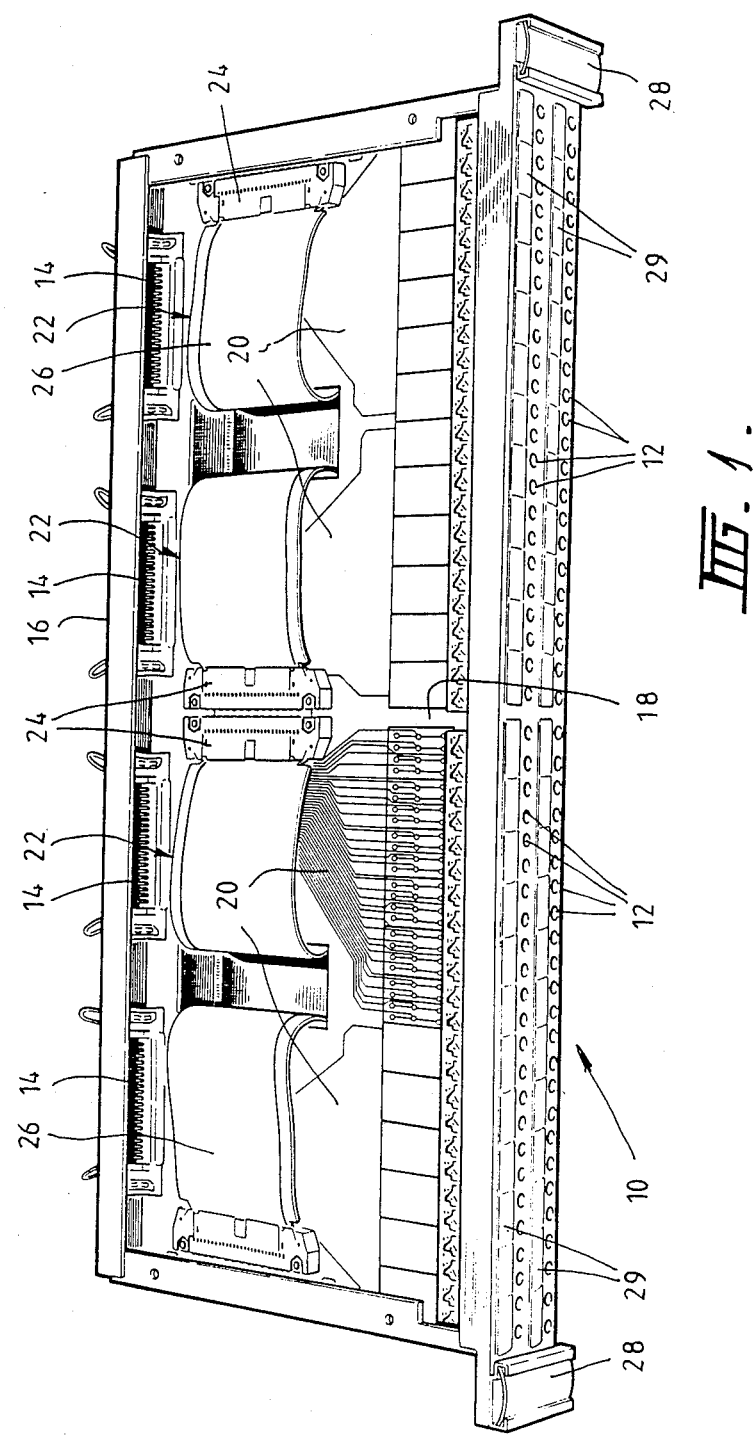

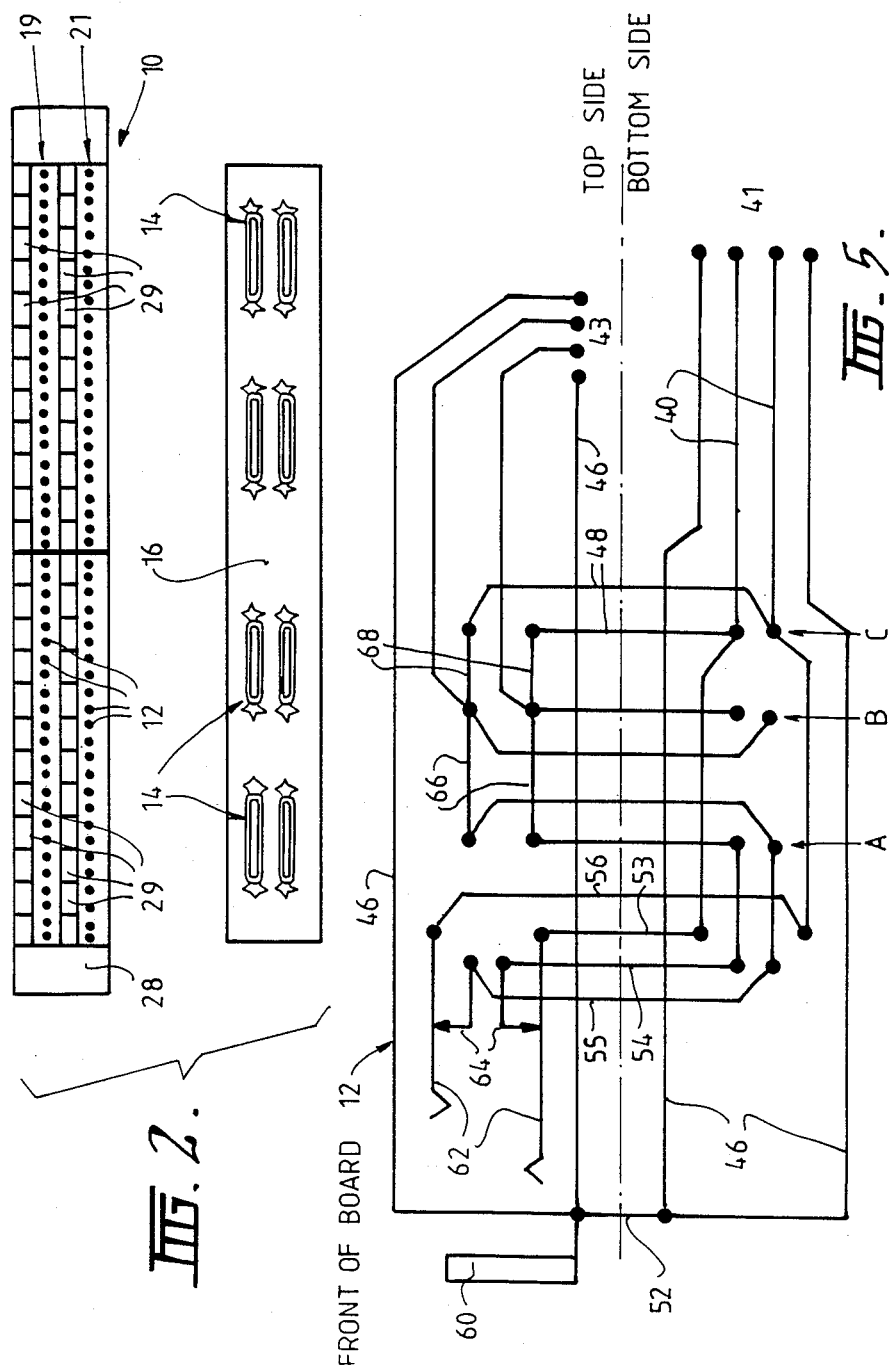

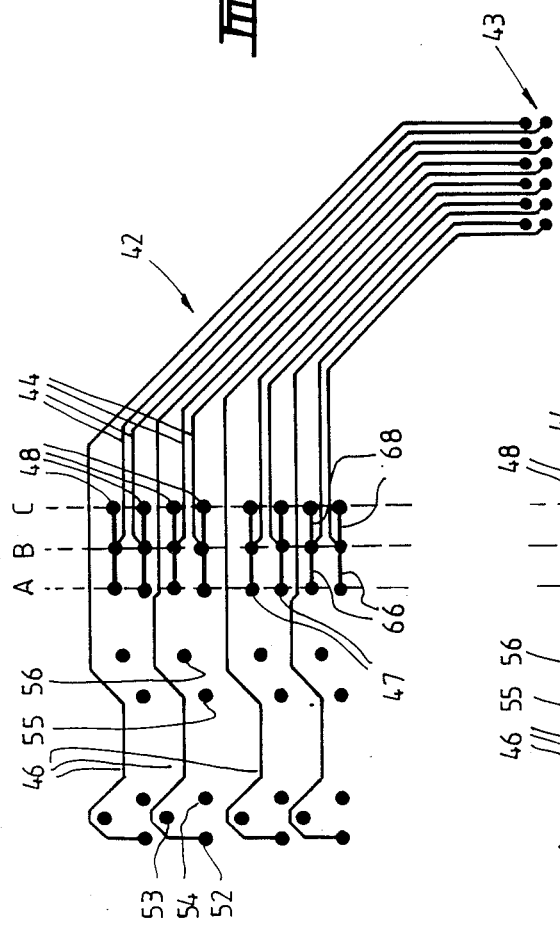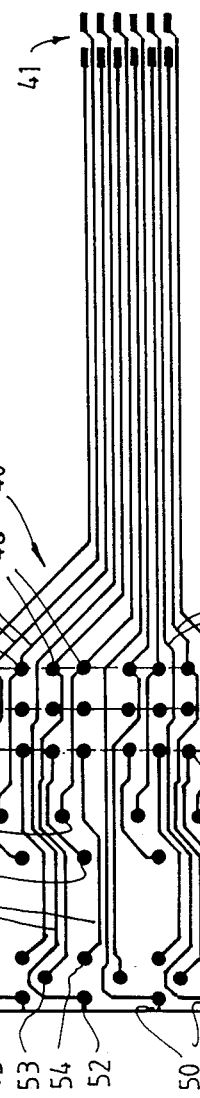

PATCHFIELD SYSTEM

FIELD OF THE INVENTION

The present invention relates to a patchfield system, and relates particularly to a printed circuit patchfield assembly of the kind employed for patching of audio circuits in the recording, broadcasting, television, telecommunications and telephone industries.

DISCUSSION OF THE PRIOR ART

Jack panels or patch panels are well known in the broadcasting and telecommunication industries where they are used extensively to provide flexibility in the interconnection of audio circuits. By employing a patch panel various circuits can be connected together temporarily using one or more patch cords provided with plugs that are received in a plurality of jacks mounted in the front of the panel. A prior art patch panel typically consists of two rows of jacks accommodated in a panel designed to be mounted in standard 19' equipment racks. Each jack is provided with wire-wrap or solder type terminals on its rear to which the circuits involved in patching are directly connected.

More recently, a patch bay has been manufactured which consists of a standard front patch panel and an additional rear terminal panel interconnected by a loom of cables electrically connecting each jack terminal to a terminal in the rear panel. With this type of prior art patch bay, circuits involved in patching can be connected to and disconnected from the rear panel more easily because the terminals on the rear panel are more accessible to the user.

However, the cost of the cables in the loom and the labor involved in wiring each cable to the terminals of the jacks in the front panel and the terminals in the rear panel adds considerable expense to the overall cost of this type of prior art system.

A different approach was taken by Switchcraft Inc. in their printed circuit jackfield. The Switchcraft (Reg. Trade Mark) jackfield employs a double-sided printed circuit board (p.c.b.) to interconnect each jack in the front patch panel to the terminal connectors on the rear panel and therefore does away with cable wiring altogether. A disadvantage of the Switchfield (Reg. Trade Mark) jackfield is the problem of cross-talk between adjacent tracks of the printed circuit wiring, which lie in close proximity, particularly at higher signal frequencies. In U.S. Pat. No. 4,655,535 (Assignee Switchcraft Inc.) a jackfield assembly comprising a linear array of jack modules disposed along one edge of a p.c.b. is described. Each of the jack modules includes a stacked series of electrical jacks and is provided with a snug-fitting post on a supporting surface thereof. The post is received in a corresponding aperture provided in the p.c.b. to lock the modules to the p.c.b. and thus prevent movement of the modules relative to the p.c.b.. Each of the modules includes two jacks having switches electrically connected by an electrical shunt to simplify the electrical connections required of the tracks on the p.c.b.

In the above kinds of prior art patch panels the two rows of jacks are typically interconnected in various configurations determined by the manufacturer to provide normalling between each corresponding pair of jacks in the top and bottom row. Throughout this specification "normalling" refers to the interconnection of various ones of the springs within a jack in one row with various ones of the springs in a corresponding jack in the other row, whereby the springs of a pair of jacks are normally connected before a plug is inserted in one of the jacks in the pair. Full normalling refers to the arrangement whereby inserting a plug into either one of the jacks in a pair breaks the connection to the other jack in that pair. Half normalling refers to the arrangement whereby inserting a plug into one jack of the pair does not break the connection to the other jack in that pair, whereas inserting the plug into the other jack does. Normalling is usually provided to connect one piece of equipment connected to one row of jacks to another piece of equipment connected to the other row in a standard configuration. The use of patch cords enables a non-standard reconfiguration of the system or part thereof. Normalling sometimes obviates the need for any patch cords in a large standard system. Normalling is also sometimes employed in order to enable monitoring of a circuit connected to one row of jacks by another circuit connected to the other row.

In the prior art patch panels the panel comes from the manufacturer with the jacks already hard wired into a particular normalling configuration which can only be changed with great difficulty by the user having to desolder the wires connecting the jacks, or soldering or wire-wrapping the necessary interconnecting wires between terminals of the jacks at the rear of the patch panel. In the Switchcraft (Reg. Trade Mark) jackfield normalling between the jacks in the top and centre rows is provided but it cannot be altered by the end user and is set by the manufacturer.

SUMMARY OF THE INVENTION

The present invention was developed with a view to providing an improved patchfield assembly which is less susceptible to one or more of the abovementioned disadvantages inherent in the prior art.

According to one aspect of the present invention there is provided a printed circuit patchfield assembly for patching of audio circuits, the assembly comprising:

a plurality of electrical jack means adapted for mounting in a front panel of the assembly;

an electrical connecting means adapted for mounting in a rear connector panel of the assembly; and a printed circuit board having a plurality of first electrically conducting tracks provided thereon for electrically interconnecting said jack means and said connecting means, wherein said conducting tracks are arranged substantially parallel and in close proximity to one another, and wherein in addition to said first conducting tracks there is provided a plurality of second electrically conducting tracks on the printed circuit board, said second conducting tracks being arranged between said first conducting tracks and parallel thereto whereby, in use, said second conducting tracks can be held at earth potential to shield adjacent circuits of said first conducting tracks, and thereby substantially reduce crosstalk on the printed circuit board between said adjacent circuits.

Preferably each of said adjacent circuits comprises a pair of said first conducting tracks arranged on one side of the printed circuit board.

According to another aspect of the present invention there is provided a printed circuit patchfield assembly for patching of audio circuits, the assembly comprising:

a plurality of electrical jack means adapted for mounting in a front panel of the assembly, wherein said plurality of jack means are arranged into a first and a second group;

a plurality of rear electrical connecting means adapted for mounting in a rear connector panel of the assembly;

first and second double-sided printed circuit boards, said first board having a first plurality of electrically conducting tracks on a first side thereof for electrically interconnecting said first group of jack means to one of said rear connecting means, said second board having a first plurality of electrical conducting tracks on a first side thereof for electrically interconnecting said second group of jack means to another one of said rear connecting means, and wherein said first and second boards are further provided with a second plurality of electrically conducting tracks on the respective second sides thereof for electrically interconnecting said first and second group of jack means; and internal electrical connecting means whereby the second plurality of tracks on said first board can be electrically interconnected to the second plurality of tracks on the second board.

Preferably said first and second printed circuit boards of the patchfield assembly are each provided with a plurality of through-holes through which each one of said first plurality of conducting tracks can be electrically connected to a corresponding one of said second plurality of conducting tracks.

BRIEF DESCRIPTION OF THE DRAWINGS

In order that the invention may be more clearly understood a preferred embodiment of the patchfield assembly will now be described, by way of example only, with reference to the accompanying drawings in which:

FIG. 1 is a perspective view of a preferred embodiment of the patchfield assembly;

FIG. 2 illustrates the front panel and the rear panel of the assembly in FIG. 1;

FIG. 3 is a plan view of a portion of the printed circuit tracks on one side of a printed circuit board of the preferred embodiment;

FIG. 4 is a plan view of a corresponding portion of the printed circuit tracks on the other side of a printed circuit board of the preferred embodiment;

FIG. 5 illustrates schematically the preferred manner of connecting a jack to its corresponding through-holes and printed circuit tracks on the printed circuit board of the preferred embodiment;

DESCRIPTION OF PREFERRED EMBODIMENTS

Figure 6:
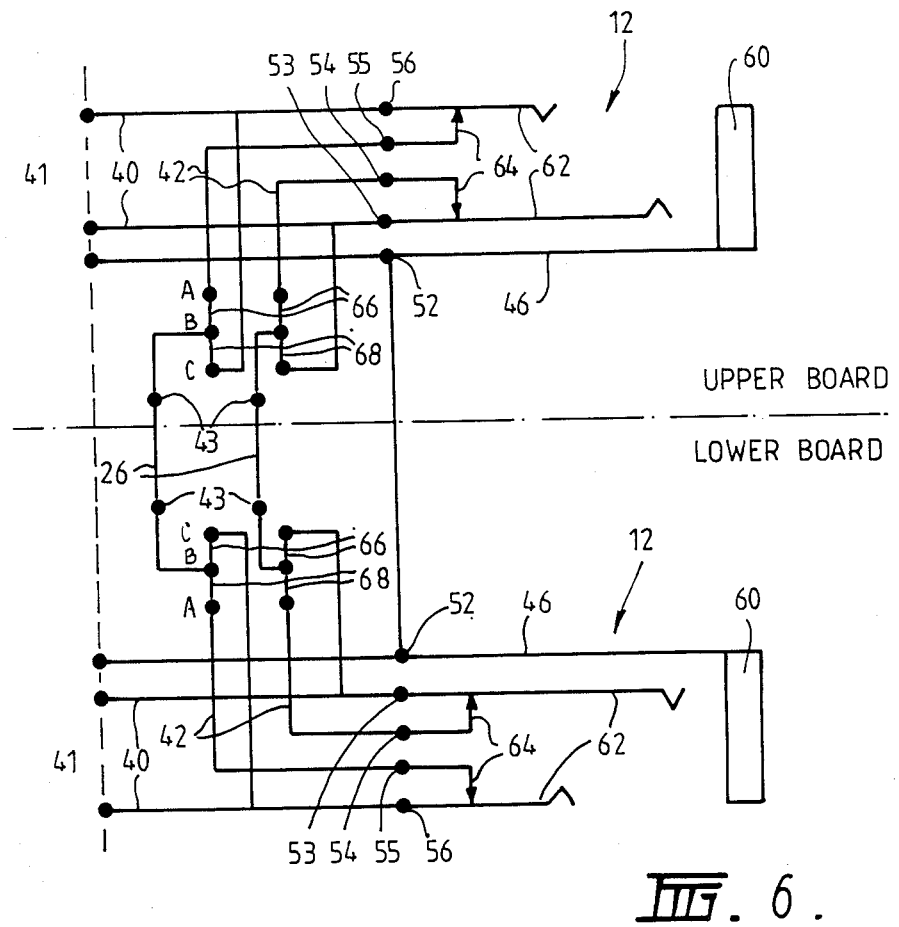
FIG. 6 illustrates schematically the preferred manner of interconnecting a pair of jacks; and, FIG. 7 illustrates schematically an alternative technique of selecting a desired normalling option.

Referring to FIG. 1 there is shown in perspective view a preferred embodiment of the patchfield assembly according to the present invention. The assembly comprises a front patch panel 10 illustrated more clearly in FIG. 2, having a plurality of electrical jack means 12 mounted therein, a plurality of rear electrical connecting means 14 mounted in a rear connector panel 16 and a printed circuit board (PCB) 18 having a plurality of electrical conducting tracks 20 provided thereon. Preferably, the jack means 12 are arranged into a first group 19 and a second group 21 which in the embodiment of FIGS. 1 and 2, are mounted in two rows of 48 jacks each. The first row of jacks 19 are connected to a first PCB 18, and the second row of jacks 21 are connected to a second PCB (not shown) which is located directly beneath the first PCB 18 and is substantially identical thereto. The preferred embodiment of the patchfield assembly illustrated in FIG. 1 further comprises a plurality of internal electrical connecting means 22 which each consist of a multi-contact connector 24 and a ribbon cable 26. The multi contact connector 24 is preferably a 40 contact ribbon cable connector having a receptacle mounted at right angles on the PCB and adapted to receive a plug of the insulation displacement type which is connected directly to the ribbon cable 26. The internal electrical connecting means 22 is provided so that the conducting tracks 20 on the first PCB 18 can be electrically interconnected with a corresponding plurality of conducting tracks on the second PCB located directly below. The internal electrical connecting means 22 provides the user of the assembly with a first degree of freedom in relation to a required normalling configuration between the first row of jacks 19 and the second row of jacks 21, as will be described in more detail below. The front patch panel 10 of the assembly is also provided with vertical designation strips 28 and horizontal designation strips 29 which enable the user to label the jacks with appropriate designations. The complete patchfield assembly is housed in an aluminium case to provide full electrical shielding.

The printed circuit board 18 of this embodiment is a double-sided printed circuit board having a first plurality of electrically conducting tracks on a first side thereof for electrically interconnecting the first group of jacks 19 to respective ones of the rear connecting means 14, and having a second plurality of electrically conducting tracks on the second side thereof for electrically interconnecting the first group of jacks 19 to the second group of jacks 21. Preferably, the tracks connecting the jacks 19 to the rear connectors 14 are provided on the bottom side of the PCB 18 and the tracks used for interconnecting the first group of jacks 19 to the second group of jacks 21 are on the top side of the PCB. FIGS. 3 and 4 show in plan view a portion of the printed circuit pattern on the top side and the bottom side respectively of the printed circuit board 18 in FIG. 1.

The jacks 12 of the patchfield assembly are preferably printed circuit board jacks which can be mounted directly onto the PCB 18 by inserting the jack terminals into through-holes provided along the front edge section of the PCB. Each jack is provided with five terminals and the printed circuit patterns in FIGS. 3 and 4 are provided with groups of five corresponding through-holes 52 to 56 in the section along the front of the board. In this embodiment the jacks employed are dual jacks provided with 10 pins each, 5 pins per jack.

FIG. 4, illustrating the printed circuit pattern on the bottom side of the PCB, includes a plurality of first conducting tracks 40 for interconnecting the jack means 12 connected to the pattern at the front of the board and the rear connecting means 14 connected to the pads 41 at the rear of the board. FIG. 3, illustrating the printed circuit pattern on the top side of the PCB 18 includes a second plurality of conducting tracks 42 for electrically interconnecting the jacks 12 connected to the pattern at the front of the board and the multi-contact connector 24 of the internal connecting means 22 mounted laterally on the board in the pads 43 of the pattern.

In both FIGS. 3 and 4 two kinds of electrically conducting tracks can be distinguished. A plurality of first electrically conducting tracks 44 are arranged in pairs, substantially parallel and in close proximity to one another for interconnecting the jack means and the respective connecting means on both sides of the PCB. A plurality of second electrically conducting tracks 46 are also provided on the PCB, the second conducting tracks 46 being arranged between the first conducting tracks 44 and substantially parallel thereto whereby, in use, the second conducting tracks 46 can be held at earth potential to shield adjacent pairs of the first conducting tracks 44 and thereby substantially reduce crosstalk on the printed circuit board between the adjacent circuit pairs. In FIG. 4 it can be seen that the second conducting tracks 46 are all connected by an earth rail 45 arranged along the front edge of the PCB.

Measurements of the crosstalk performance of the patchfield assembly have demonstrated that crosstalk between adjacent circuits is very low: less than 90 dB at 20 kHz.

These crosstalk performance figures were obtained using a signal generator with source impedance of 100 ohm or less and a measuring device, for example, an AC voltmeter, with an input impedance of 20 kohm. If the input impedance of the measuring device is lower even better crosstalk performance can be achieved.

In addition to the pads for connecting the jacks 12 to the PCB on the printed circuit pattern, there are also provided a plurality of further pads or doughnuts arranged in three rows indicated as A, B and C in FIGS. 3 and 4. Preferably all of the pads or doughnuts of the printed circuit pattern on one side of the board have a hole passing through the board to a corresponding pad or doughnut on the other side of the board. In this embodiment the through-holes are plated through-holes so that the first plurality of conducting tracks 40 on the bottom side of the PCB are connected by means of the through-holes 48 in row C, to the second plurality of conducting tracks 42 on the top side of the PCB. The through-holes for connecting a single jack 12 to the PCB are shown in FIGS. 3 and 4 at reference numerals 52 to 56. Through-hole 52 connects the corresponding jack terminal to the earth rail 45 via a short conducting link 50. The second conducting earth tracks 46 can be isolated from each other by cutting through the links 50 connecting pads 52 to earth rail 45. Thus the earth for each jack circuit can be isolated from adjacent circuits, which can be advantageous in certain circumstances. Furthermore, the earth tracks 46 can be divided into groups of 12 by cutting through other links (not shown) to the PCB earth plane at three points. Through-holes 54 and 55 connect the corresponding jack terminals to a first pair of conducting tracks 42 on the top side of the board, and the through-holes 53 and 56 connect the corresponding jack terminals to a second pair of conducting tracks 40 on the bottom side of the board.

The preferred manner of connecting a jack 12 to its corresponding through-holes and printed circuit tracks on the PCB is illustrated schematically in FIG. 5. FIG. 5 represents a single circuit separated from adjacent circuits by earth tracks 46 on both sides of the PCB. In FIG. 5 the jack comprises an aperture ring 60 which is held at earth or ground potential because it is connected to the jack terminal which is received in the through-hole 52. The jack further comprises a pair of main springs 62 which are connected by their corresponding jack terminals through the through-holes 53 and 56 to the conducting tracks 40 on the bottom side of the PCB. As can also be seen in FIG. 4, the tracks 44 on the bottom side of the PCB connect to the through-holes 48 in row C before being let out to the rear of the board to the pads 41 on which the rear connecting means 14 is mounted. A pair of normal springs 64 in the jack are connected by means of their corresponding jack terminals through the through-holes 54 and 55 to the PCB.

Referring to FIG. 4, the through-holes 54 and 55 are connected by a printed circuit track to a respective one of a pair of pads 47 in row A of the printed circuit pattern. Each one of the pair of pads in row A is connected to a respective one of a pair of pads in row B by a short length of conducting track 66 (see FIG. 3), and each of the pads in row B is connected to a respective one of a pair of pads in row C by a short length of conducting track 68 (see FIG. 3). This particular arrangement of pads in rows A, B and C, and the corresponding short lengths of conducting track 66 and 68 give the user of the patchfield assembly a further three degrees of freedom in selecting a desired normalling configuration, to be described in more detail below. A pair of second conducting tracks 42 are connected to the pads in row B on the top side of the board and are led out towards the rear of the board to the pads 43 on which the internal connecting means 22 is mounted. Electrical conducting tracks 46 are held at earth potential and provide shielding for adjacent circuit pairs. It will be appreciated that with the circuit shown in FIG. 5, even when a plug is inserted into the jack 12 to break the contacts between the main springs 62 and the normal springs 64, the conducting tracks 42 which lead out from the normal springs 64 will normally be electrically connected to the main springs 62 through the short lengths of conducting track 68 and the through-holes 48. The various user selectable normalling options will now be described with reference to FIG. 6.

FIG. 6 illustrates a pair of jacks 12 mounted on the upper board and the lower board respectively of the preferred embodiment of the patchfield assembly. The connection of the jacks 12 to the PCB through-holes and the pattern of printed circuit tracks has been simplified in FIG. 6 in order to avoid confusion. However, the like reference numerals designate the same elements and parts as in FIG. 5. The main springs 62 and the normal springs 64 are normally connected as described above. Accordingly, if the internal connecting means 22, comprising the ribbon cable 26 provided with insulation displacement connector plugs, is in place, electrically interconnecting the second pair of tracks 42 on the upper board to the corresponding pair of tracks 42 on the lower board, all of the springs in the jacks of the first group 19 will be electrically connected to all of the corresponding springs in the jacks of the second group 21. If no normalling between the two rows of jacks is required then the user can simply remove the internal connecting cable 22. Each of the earth tracks 46 is provided with a corresponding earth wire in the ribbon cable 22 in order to maintain the crosstalk performance in the internal cables.

In this embodiment of the patchfield assembly the internal connecting means 22 comprises ribbon cable 26 and insulation displacement connectors 24, however in an alternative embodiment the connecting means 22 may comprise a multi-contact connector plug on the bottom side of the upper board which is received in a corresponding multi-contact connector receptacle mounted on the top side of the lower board. In this alternative embodiment it would not be possible to disconnect the internal connecting means, however the no normalling option can still be obtained by cutting through the short lengths of conducting track 66 and 68 which connect the through-holes in row A, B, C. More simply still, the pads or doughnuts in rows A and C can simply be removed by drilling a dimple in the printed circuit board with an appropriately sized drill bit without actually drilling through the board. The depth of dimple required would be approximately 1.0 mm. In FIGS. 3 and 4 it can be seen that the pads or doughnuts in rows A, B and C are approximately 1.8 mm in diameter so that a 3 mm diameter drill bit could effectively remove the pads in rows A and C and disconnect the internal connecting means 22 from both the upper and lower board. This method could also be used with the removable internal connecting means 22 of the described embodiment.

An advantage of dimpling the pads in rows A and C, rather than drilling all the way through the plated through-holes, is that the connection between the through holes in rows A and B, or rows C and B, can be restored quite easily by inserting a short U-shaped bridging link on the component side of the PCB and soldering each end of the link in the respective plated through-holes on the solder side of the PCB.

If a full normal connection is required between the upper and lower board the user can simply cut through the short lengths of conducting track 68 on both the upper and the lower PCB. Alternatively, the user can simply drill out the pads in row C on both the upper and lower PCB. Drilling out the pads in row C has the effect of disconnecting the printed circuit connection between the main springs 62 and the normal springs 64. Accordingly, if a half normal connection is required from say the top row of jacks 19 to the bottom row of jacks 21 of the patchfield, then only the pads in row C on the bottom PCB need to be drilled out. Conversely if a half normal connection is required from the bottom row of jacks 21 to the top row of jacks 19, then only the pads in row C on the top PCB need be drilled out. From the above description it will be apparent that the provision of the three rows of pads A, B and C in conjunction with the internal connecting means 22 gives the user of the printed circuit patchfield assembly a great deal of flexibility in achieving the particular normalling configuration he requires.

Figure 7:
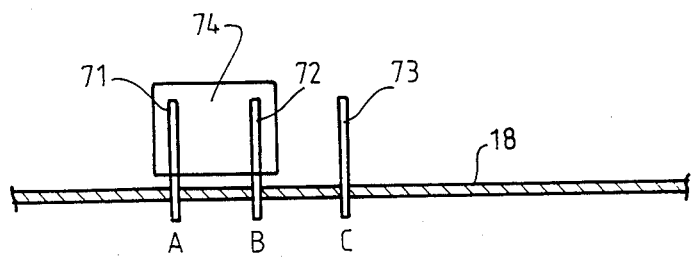

An alternative method of selecting the desired normalling option will now be described with reference to FIG. 7. Referring to FIG. 7 a section through PCB 18 is illustrated, showing the arrangement of three pins 71, 72 and 73 soldered to the PCB in the through-holes in rows A, B and C respectively. Unlike the embodiment illustrated in FIG. 3, the through-holes in rows A, B and C are not connected by short lengths of conducting tracks 66 and 68. Instead, a shunt or shorting link 74 is provided to connect pins 71, 72 or pins 72 and 73 to provide the half or full normalling options as required. No normalling can be achieved by removing the link 74 altogether from the board. An advantage of this embodiment is that it does not involve drilling of pads on the PCBs, however a disadvantage is that six pins for each jack circuit must be fitted to the boards and a large number of the links 74 must be supplied with the assembly.

In the preferred embodiment of the patchfield assembly illustrated in FIG. 1 the two rows of jacks 19 and 21 connected to the upper and lower PCB respectively are divided into four groups of twelve so that multi-contact connectors having 36 contacts each can be employed. Each connector connects to twelve pairs of printed circuit tracks corresponding to the twelve jacks in each sub group as well as twelve additional printed circuit tracks corresponding to the tracks 46 held at earth potential to provide shielding between adjacent pairs of the jack circuits. It will be apparent however that any number of jacks could have been provided in the front patch panel 10, the invention is not limited to the particular arrangement of jacks in the two rows as in the preferred embodiment.

The patchfield assembly according to the invention not only reduces material and labor costs during manufacture but also provides a much more reliable method of interconnecting the jacks to the rear connectors as the possibility of errors in wiring during wire-wrapping of cables to the jack terminals is eliminated by the use of conducting tracks on the printed circuit board.

A further significant advantage of the present invention is that it enables the application of ground plain ribbon cable and insulation displacement connectors to a patchfield assembly thereby eliminating the conventional handwiring system. Both the internal and rear connector pinouts can be configured to allow direct connection of flat ribbon cables via insulation displacement connectors without adversely affecting the crosstalk isolation between adjacent circuits.

It will be obvious to persons skilled in the audio and video arts that numerous alterations and modifications can be made to the patchfield assembly, other than those specifically described, without departing from the basic concepts of the invention. All such modifications and alterations are to be considered within the scope of the invention, the nature of which is to be determined from the foregoing description and the appended claims.

The claims defining the invention are as follows, I claim:

1. A printed circuit patchfield assembly for patching of audio circuits, the assembly comprising:
   a plurality of electrical jack means adapted for mounting in a front panel of the assembly, wherein said plurality of jack means are arranged into a first and a second group;
   a plurality of rear electrical connecting means adapted for mounting in a rear connector panel of the assembly;
   first and second double-sided printed circuit boards, said first board having a first plurality of electrically conducting tracks on a first side thereof for electrically interconnecting said first group of jack means to one of said rear connecting means, said second board having a first plurality of electrical conducting tracks on a first side thereof for electrically interconnecting said second group of jack means to another one of said rear connecting means, and wherein said first and second boards are further provided with a second plurality of electrically conducting tracks on the respective second sides thereof for electrically interconnecting said first and second groups of jack means; and,
   internal electrical connecting means whereby the second plurality of tracks on said first board can be electrically interconnected to the second plurality of tracks on the second board thereby, in use, said internal connecting means enables various normalling options to be provided between said first and second groups of jack means.

2. A patchfield assembly as claimed in claim 1, wherein said first and second printed circuit boards are each provided with through-holes which each one of said first plurality of conducting tracks can be electrically connected to a corresponding one of said second plurality of conducting tracks.

3. A patchfield assembly as claimed in claim 1, wherein said first and second printed circuit boards are both provided with a third plurality of electrically conducting tracks, arranged between and parallel to said first conducting tracks and between and parallel to said second conducting tracks whereby, in use, said third conducting tracks can be held at earth potential to shield adjacent circuits of said first and second conducting tracks respectively and thereby substantially reduce cross-talk on the printed circuit boards between said adjacent circuits.

4. A patchfield assembly as claimed in claim 3, wherein each of said adjacent circuits comprises a first pair of adjacent tracks of said first plurality of conducting tracks on the first side of the respective boards, and a second pair of adjacent tracks of said second plurality of conducting tracks on the second side of the respective boards.

5. A patchfield assembly as claimed in claim. 4, wherein said first pair of adjacent tracks are normally electrically connected to said second pair of adjacent tracks respectively by plated through-holes extending through the board.

6. A patchfield assembly as claimed in claim 5, wherein said first pair of adjacent tracks connect with a pair of main springs provided in each of said jack means, and said second pair of adjacent tracks connect with a pair of normal springs provided in each of said jack means and wherein the normal springs are normally biased into electrical contact with respective ones of the main springs of the jack means until a jack plug is inserted into the jack means, whereupon the normal springs no longer make electrical contact with the main springs.

7. A patchfield assembly as claimed in claim 6, wherein there is further provided at least one row of conducting pads on said boards at the locations of selected ones of said through-holes in electrical connection with said second plurality of conducting tracks, said pads being sized and shaped so that by drilling a dimple in each pad of said at least one row of pads on the first printed circuit board, the electrical connection through the plated through-holes can be broken to provide a half-normal connection from the second group of jack means to the first group of jack means.

8. A patchfield assembly as claimed in claim 7, wherein said pads are sized and shaped so that by drilling a dimple in each pad of said at least one row of pads on both the first printed circuit board and the second printed circuit board, the electrical connection through the plated through-holes can be broken to provide a full-normal connection between the first and second groups of jack means respectively.

9. A patchfield assembly as claimed in claim 8, wherein there is further provided a second row of conducting pads on said boards at the locations of selected other ones of said through-holes, said pads being sized and shaped so that by drilling a dimple in each pad of said one row and said second row of pads the electrical connections through the plated through-holes can be broken to provide no normalling between the first and second group of jack means.

10. A patchfield assembly as claimed in claim 9, wherein said internal electrical connecting means is in the form of a removable ribbon cable provided with multi-contact electrical connector plugs at both ends adapted to be received in first and second multi-contact electrical connector receptacles provided in electrical connection with the second plurality of conducting tracks on the first and second printed circuit boards respectively.

11. A patchfield assembly as claimed in claim 10, wherein each of said jack means comprises a jack module adapted for surface mounting on the printed circuit boards and provided with terminals for electrically connecting the main springs and normal springs respectively to the printed circuit boards, and wherein said printed circuit boards are provided with through-holes for receiving said terminals and enabling electrical connection with the respective ones of said electrical conducting tracks provided on the printed circuit boards.

* * * * *